(12) United States Patent
Best et al.

(10) Patent No.: US 7,157,664 B2
(45) Date of Patent: Jan. 2, 2007

(54) LASER HEATER ASSEMBLY

(75) Inventors: Bryant A. Best, Flowery Branch, GA (US); William G. Mahoney, Suwanee, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 11/092,520

(22) Filed: Mar. 29, 2005

(65) Prior Publication Data

US 2006/0219687 A1  Oct. 5, 2006

(51) Int. Cl.
*H05B 3/00* (2006.01)
*H01S 3/04* (2006.01)

(52) U.S. Cl. .................. 219/209; 219/494; 372/36

(58) Field of Classification Search ............... 219/200, 219/201, 209, 221, 530, 540, 534, 535, 536, 219/546, 548, 494, 510; 385/92, 14, 1, 2; 372/36, 34; 361/103
See application file for complete search history.

(56) References Cited

U.S. PATENT DOCUMENTS

| 6,677,555 B1* | 1/2004 | Kwon et al. ............... 219/209 |
| 2003/0161593 A1* | 8/2003 | Stackhouse ................ 385/92 |

* cited by examiner

*Primary Examiner*—Philip H. Leung

(57) ABSTRACT

A heated laser assembly for maintaining a set point temperature of a laser. A common transistor external to the laser is positioned in thermal proximity to the laser. A thermal transfer member is positioned in thermal contact between the laser and the transistor. The transistor heats the thermal transfer member, and thus heats the laser, when the ambient temperature drops below a set point temperature. Therefore, the overall temperature range the laser must operate over is reduce through the use of a common transistor.

13 Claims, 5 Drawing Sheets

LASER HEATER ASSEMBLY

RELATED APPLICATION

The present U.S. application is related to U.S. application Ser. No. 11/092,515 entitled "LASER HEATER CONTROLLER", which is incorporated herein by reference, and having been filed concurrently with the present application.

TECHNICAL FIELD

The present invention relates to lasers and, more particularly, relates to maintaining the laser at a constant temperature by heating the laser.

BACKGROUND OF THE INVENTION

Due to cost, many lasers do not have built-in heaters or coolers. Unless an internal thermoelectric heater/cooler is included, the case temperature of an operating laser is substantially equivalent to ambient temperature. In some cases, for example outdoor HFC applications such as CATV nodes, the case temperature can be quite extreme. Outside temperatures may reach as cold as −40 degrees Celsius.

Moreover, laser performance characteristics are very dependent upon operating case temperature. Not only do parameters such as slope efficiency and output power vary with operating temperature, but output wavelength varies as well. This can cause issues if the laser output wavelength drifts outside of the bandwidth of the combining and splitting optical passives in the network. Therefore, it is desirable to maintain the laser at as constant a temperature as possible or at least within a range that the device is designed to operate within. What is needed is an economical means to minimize performance degradation due to cold temperatures and to extend the lowest temperature a laser can operate at.

BRIEF DESCRIPTION OF THE DRAWINGS

FIG. 3 illustrates an exploded view of the heater assembly of FIG. 1.

DETAILED DESCRIPTION

The present invention will be described more fully hereinafter with reference to the accompanying drawings in which like numerals represent like elements throughout the several figures, and in which an exemplary embodiment of the invention is shown. This invention may, however, be embodied in many different forms and should not be construed as being limited to the embodiments set forth herein; rather, the embodiments are provided so that this disclosure will be thorough and complete, and will fully convey the scope of the invention to those skilled in the art. The present invention is described more fully hereinbelow.

Figure 1:
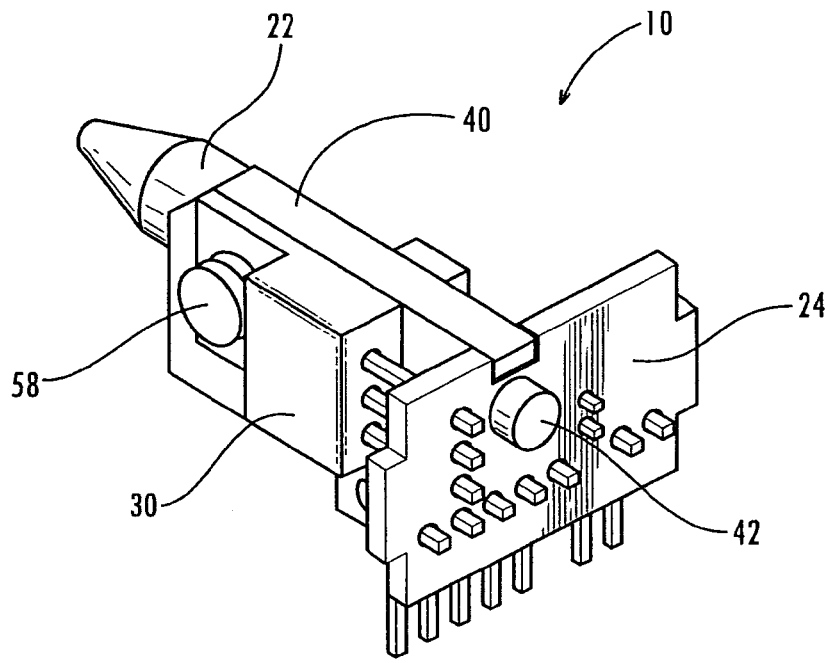
FIG. 1 illustrates a perspective view of one embodiment of a thermostatically controlled heater assembly of the present invention.
Figure 2:
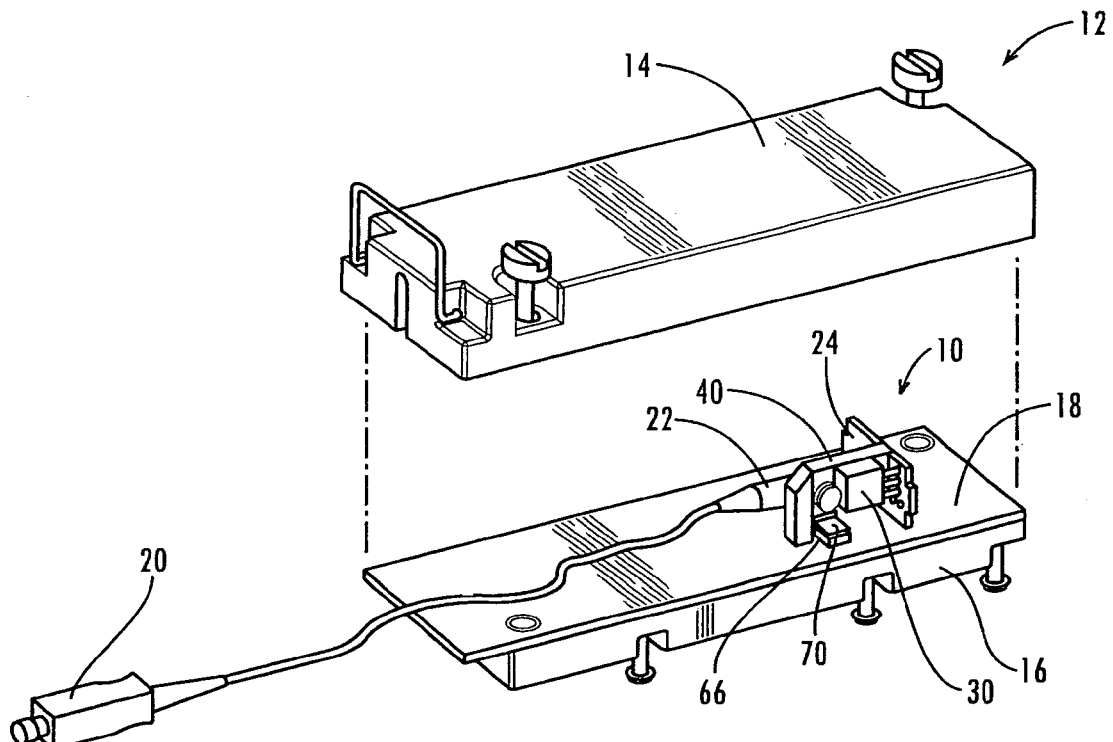
FIG. 2 illustrates a perspective view of the heater assembly of FIG. 1 utilized in an optical transmitter of a CATV node.
Figure 1:
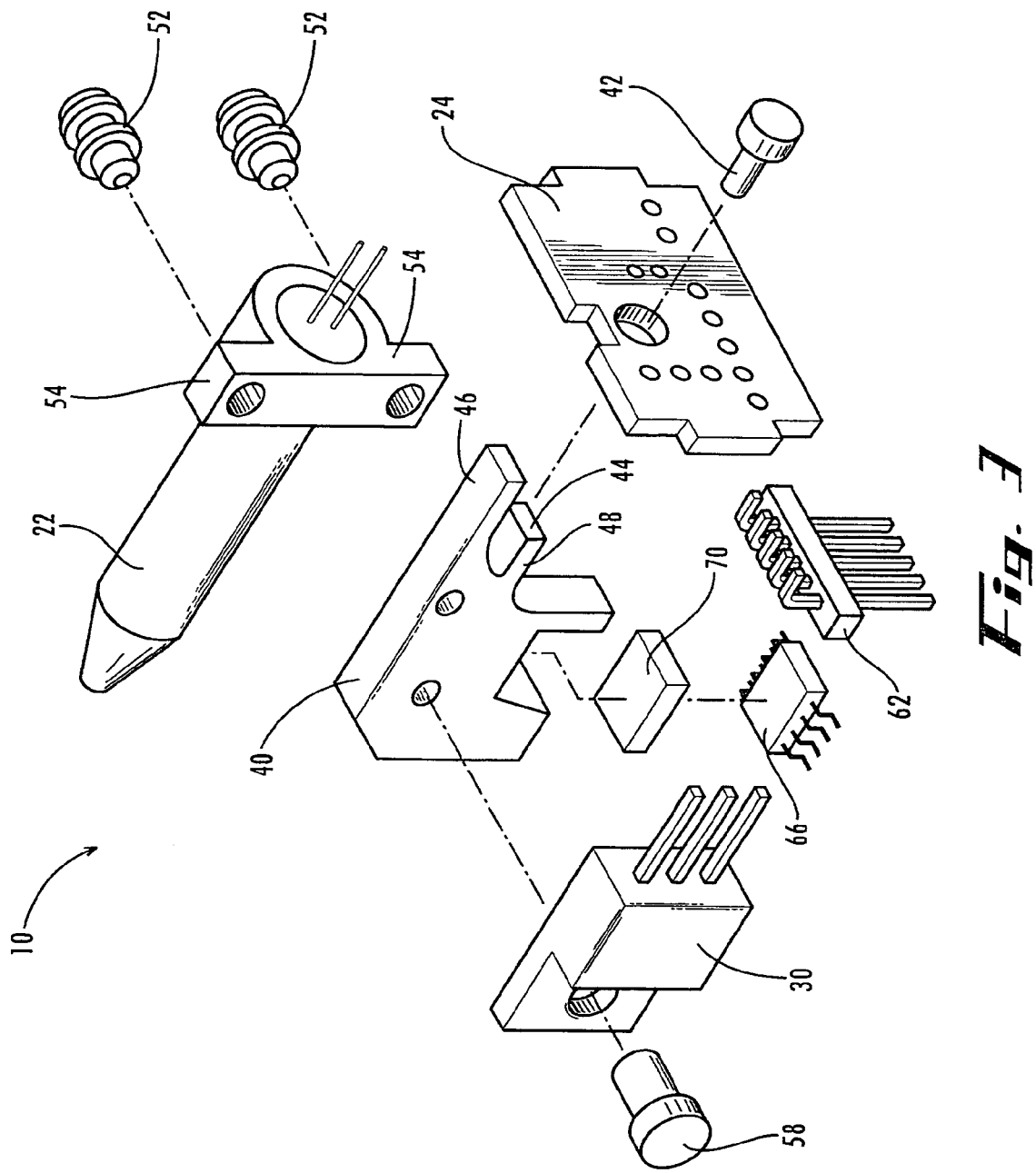

FIG. 1 illustrates one embodiment of a thermoelectric heater assembly 10 of the present invention. The heater assembly 10 of FIG. 1 is utilized, for example, in a CATV node as a coarse wave division multiplexing (CWDM) reverse transmitter 12 as shown in FIG. 2. The transmitter 12 includes a top cover 14 and a bottom cover 16 for housing a transmitter printed circuit board 18 with fiber optic cable having a fiber connector 20. However, the heater assembly 10 may be implemented as part of other laser designs where it is desirable to reduce the overall temperature range that a laser must efficiently operate at and where an economical solution is desired.

FIG. 3 illustrates an exploded view of the heater assembly 10 of FIG. 1. One embodiment of the present invention allows the heater assembly 10 to be a plug-in type modular assembly which can be used with many different frequency lasers for different applications. The heater assembly 10 includes a laser 22 adapted to be electrically and mechanically coupled to a laser printed circuit board 24 as shown in FIG. 1. The heater assembly 10 also includes a heating element or heater such as heater transistor 30 which is also electrically and mechanically coupled to the circuit board 24. A thermal transfer member or heat sink, such as a metal plate or block 40, is positioned in between the mounted laser 22 and heater transistor 30 as best shown in FIG. 1. Preferably, the heater transistor 30 and the laser 22 directly abut opposite sides of the block 40 for the best thermal connection. Heat generated from the transistor 30 is directly absorbed by the block 40 and then transferred to the laser 22. Therefore, the laser 22 is indirectly heated by the transistor 30 external to the laser 22.

The block 40 is preferably thin aluminum to facilitate transferring heat from the heater transistor 30 to the laser 22 through low thermal impedance and to minimize heating delay through thermal mass. The block 40 may be mechanically coupled to the circuit board 24 with a fastener such as screw 42 which is received in opening 44 defined between protruding portion 46 and protruding portion 48 of the block 40. However, other means for mechanically securing the block 40 to the circuit board 24 exist depending on the type and configuration of the thermal transfer plate or heat sink used. The block 40 may also be mechanically secured to a printed circuit board 18 of the transmitter 12. The circuit board 24 and the block 40 are preferably mounted in substantially a vertical manner on the circuit board 18 of the transmitter 12 in order to lift the laser 22 and the transistor 30 away from the circuit board 18 to economize the space on the circuit board 18.

Preferably, the laser 22 is directly mounted to the block 40 with mechanical fasteners such as screws 52 through laser flange members 54 as best shown in FIG. 3. Also, the heater transistor 30 is directly mounted to the block 40 with a mechanical fastener such as a screw 58. However, other means of securing the laser 22 and the heater transistor 30 to the block 40 may be used.

As best shown in FIG. 3, the laser assembly 10 may include a right angle header 62 to electrically couple the circuit board 24 to the circuit board 18 of the transmitter 12. The laser assembly may also include a temperature sensor 66 positioned underneath the block 40 and electrically coupled to the circuit board 18. The temperature sensor 66 measures the temperature of the block 40, and thus the temperature of the laser 22, and feeds this information to the heater controller describer below. Preferably, a thermally conductive material such as grease or a thermal pad 70 is used between the block 40 and the sensor 66 to improve thermal conductivity as well as absorb any dimensional tolerances between the block 40 and the temperature sensor 66.

Figure 4:
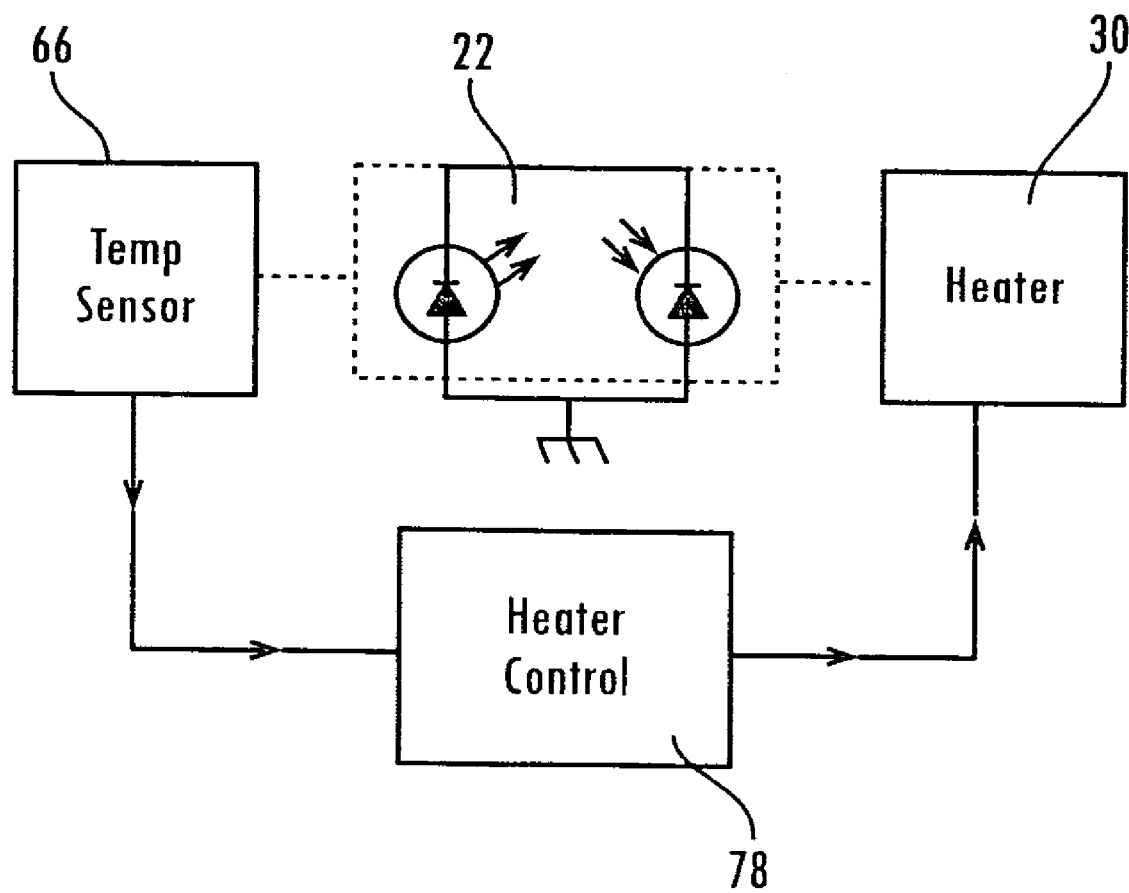
FIG. 4 illustrates a generalized block diagram of one embodiment of the present invention.

FIG. 4 illustrates in a generalized manner the laser 22 with thermal connections to the heater transistor 30 and the temperature sensor 66. The temperature sensor measures the temperature of the laser 22 and feeds this information as an input to a heater control circuit 76. The heater control circuit 76 determines whether to increase or decrease the amount of heating. The output of the heater control circuit 76 is fed to the heater transistor 30 which produces heat in proportion to the control signal from the heater control circuit 76.

Figure 5:
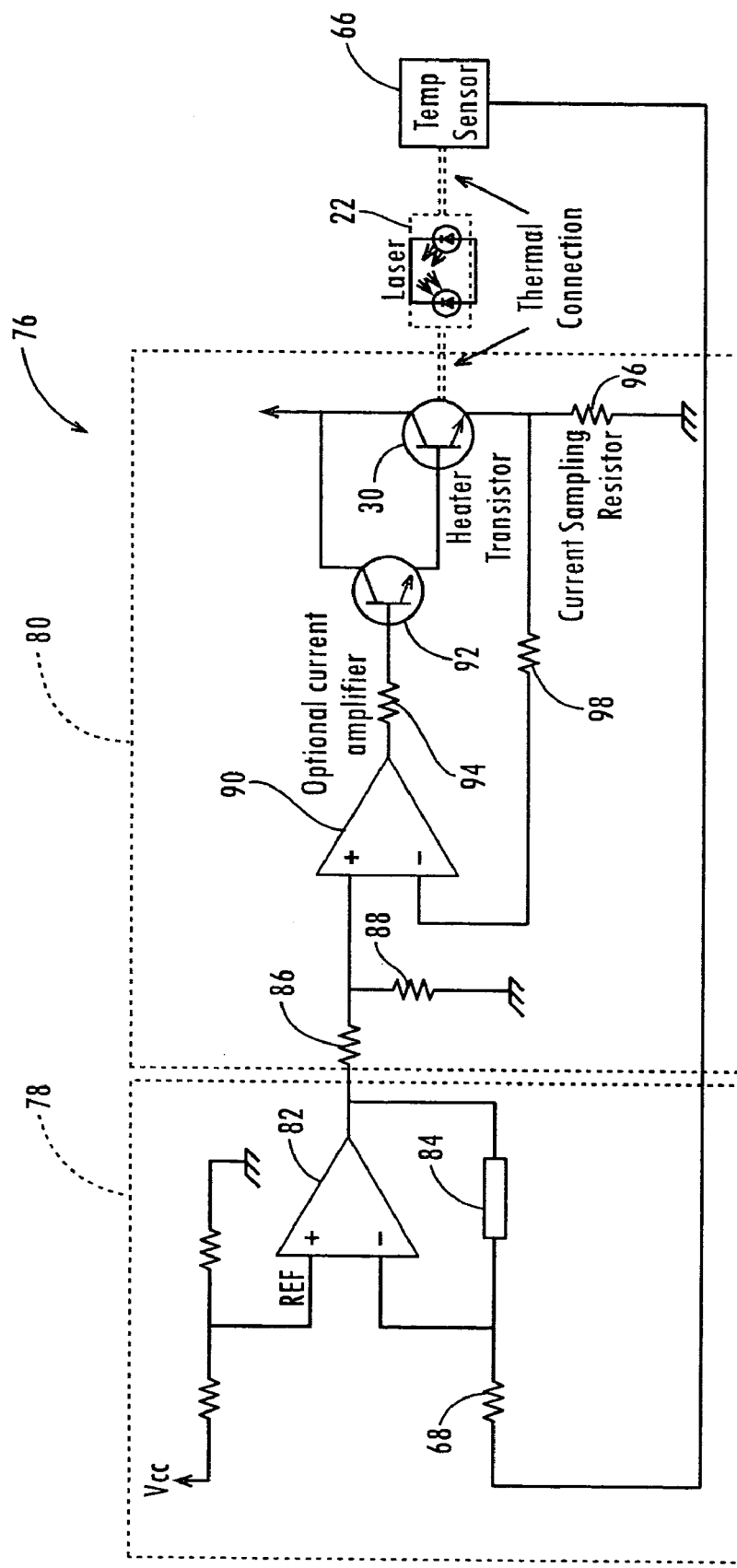
FIG. 5 illustrates one embodiment of a controller circuit for controlling the temperature of a laser according to the present invention.

FIG. 5 illustrates one embodiment of the heater control circuit 76 having controller circuitry 78 and voltage to current converter circuitry 80. The controller circuitry 78 of the heater control circuit 76 includes a controller 82. The controller 82 compares the temperature measured by the temperature sensor 66 to a desired set point temperature and produces an output voltage that produces more or less heat in an effort to make the temperature of the block 40 equal to the set point temperature. When ambient temperatures rise above the set point temperature, the heater transistor 30 will turn off and becomes passive until the ambient temperature drops back below the set point temperature.

Depending on the requirements of the circuit, the controller 82 may be an integrating or proportional controller, or both. If an integrating controller is selected, the time constant of the integrator must be set long enough to compensate for thermal lag due to heating the block 40 and the laser 22. Proportional controllers have the advantage of less settling time, but may have a static error between laser temperature and set point temperature the magnitude of which is dependent on loop gain.

Still referring to FIG. 5, the controller 82 has two inputs, a reference voltage (REF) produced by a resistive divider on the positive input, and the output of the temperature sensor 66 on the negative input. The temperature sensor 66 is input to the controller 82 through an input resistor 68 with feedback provided from the output to the negative input through impedance 84. The output voltage of the controller 82 is used to drive the heater transistor 30 and is proportional to the amount of heat generated in the heater transistor 30. As shown in FIG. 5, the controller 82 output voltage is scaled through a simple voltage divider to ground provided by resistors 86 and 88. The output of the voltage divider is connected to the noninverting input of op amp 90. The output of op amp 90 is connected to the base of transistor 92 through resistor 94.

However, transistor 92 is not required but can be used if needed to drive the heater transistor 30. If the heater transistor 30 is a BJT transistor and if either op amp 90 has a low drive current or the gain, β, of the heater transistor 30 is low, transistor 92 may be used for additional current gain. This is accomplished by connecting transistor 92 and transistor 30 in the Darlington configuration in which the emitter of transistter 92 connects to the base of the heater transistor 30 and the collectors of both transistors 30, 92 are connected to the voltage supply Vcc. Current passing through heater transistor 30 produces the desired heat and is measured by the voltage created by passing the current of the heater transistor 30 through a current sampling resister 96. Negative feedback from resistor 98 is provided to op amp 90 through resistor 98. Heat produced by the heater transistor 30 is conducted to the laser 22 through the thermal connection provided by the block 30 which conducts heat to the temperature sensor 66 that feeds a signal back to the controller 82 as described above.

Figure 6:
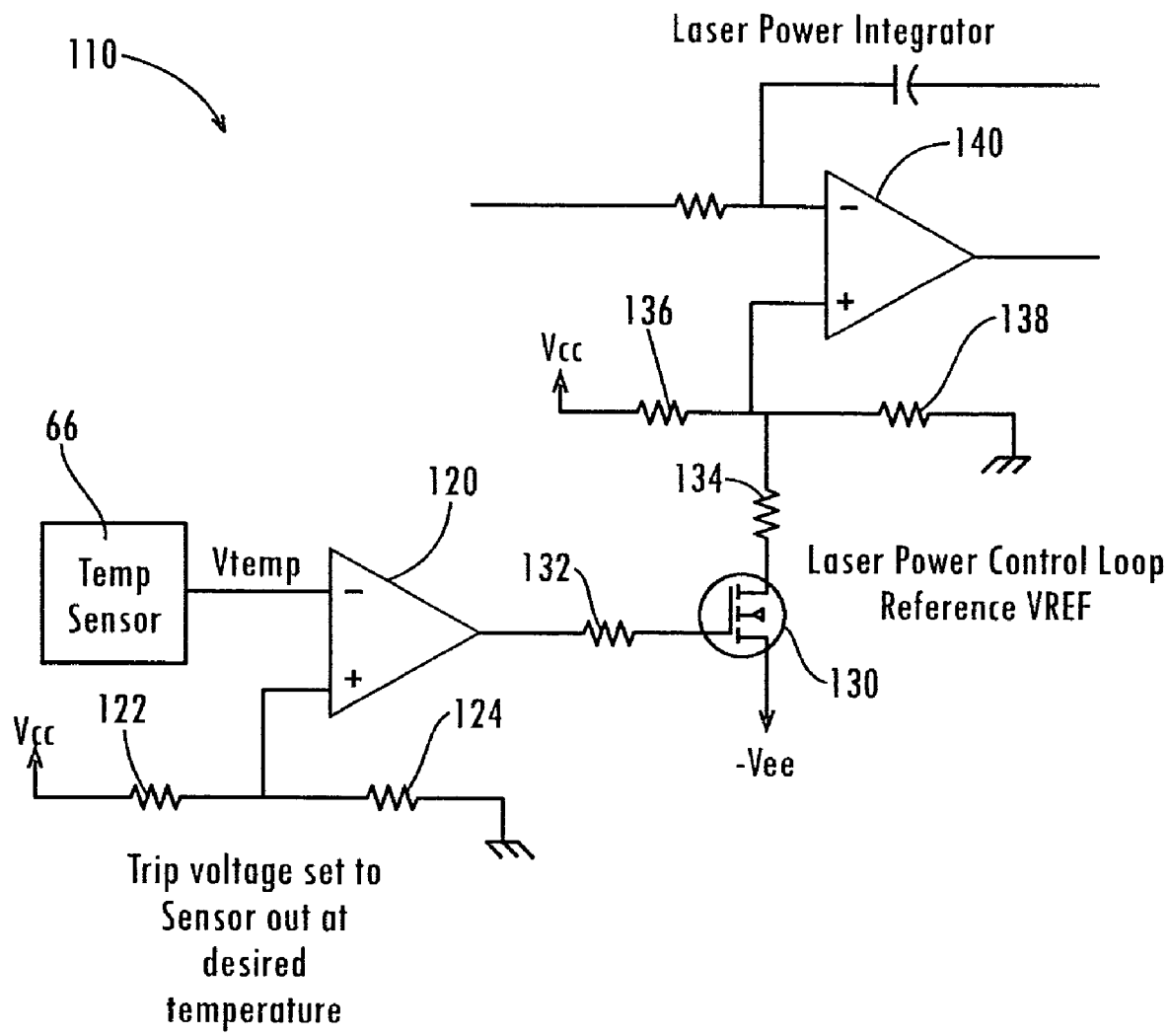
FIG. 6 illustrates one embodiment of a temperature dependent laser enable circuit according to the present invention.

In cases where the laser 22 should not be allowed to operate below a certain temperature, a temperature based enable circuit should be employed. FIG. 6 illustrates one embodiment of a temperature based enable circuit 110, commonly referred to as a comparator circuit, for use with the laser assembly 10 and the control circuit 76. The circuit 110 precludes the laser 22 from turning on until the temperature of the laser 22 is above the set point temperature. A simple comparator circuit can be used to pull the laser power control loop reference to a voltage which will force laser output power to zero.

Still referring to FIG. 6, the temperature based enable circuit 110 includes a comparator 120 which monitors and compares input voltages from a reference trip point and the output of the temperature sensor 66. The reference trip point voltage is set by the resistive divider of resistor 122 and resistor 124. The output of comparator 120 is indicative of whether the temperature of laser 22 is above or below the reference trip point. The gate of a transistor 130 is driven by the output of comparator 120 through resistor 132 allowing transistor 130 to function as a switch. The switch function of transistor 130 acts upon the laser power control loop reference, Vref, of the integrator circuit 140. When the transistor 130 is "ON", or saturated, the laser power control loop reference voltage, Vref, is brought to zero volts or slightly negative which forces the laser power to zero. The Vref voltage when transistor 130 is "ON" is shifted by the value of Vee and the resistor 134. The Vref voltage when the transistor 130 is "OFF" is set by the voltage divider of resistors 136 and 138 from Vcc. Turning transistor 130 on and off effectively changes the reference voltage of the circuit that controls laser output power.

The foregoing has broadly outlined some of the more pertinent aspects and features of the present invention. These should be construed to be merely illustrative of some of the more prominent features and applications of the invention. Other beneficial results can be obtained by applying the disclosed information in a different manner or by modifying the disclosed embodiments. Accordingly, other aspects and a more comprehensive understanding of the invention may be obtained by referring to the detailed description of the exemplary embodiments taken in conjunction with the accompanying drawings, in addition to the scope of the invention defined by the claims.

What is claimed is:

1. A heater assembly for heating when ambient temperature drops below a set point temperature, said heater assembly comprising:
    a laser;
    a heater external to said laser;
    a thermal transfer member positioned at least partially in thermal contact with said laser and said heater, wherein said heater heats said thermal transfer member and said laser to maintain said set point temperature for said laser when ambient temperature is below said set point temperature; and
    a temperature sensor in thermal contact with said thermal transfer member for sensing the temperature of said thermal transfer member wherein said temperature sensor is mounted directly on a printed circuit board of a fiber optic transmitter.

2. The heater assembly of claim 1 wherein said heater is off when said ambient temperature is above said set point temperature.

3. The heater assembly of claim 1 wherein said heater is a transistor.

4. The heater assembly of claim 1 further comprising a thermally conductive material between said temperature sensor and said thermal transfer member.

5. The heater assembly of claim 1 wherein said laser and said heater are mounted to a circuit board of said laser and said laser circuit board is mounted in a vertical manner to said fiber optic transmitter circuit board to economize space on said fiber optic transmitter circuit board.

6. The heater assembly of claim 1 wherein said thermal transfer member is positioned in between said laser and said heater.

7. The heater assembly of claim 1 further comprising a controller for determining when to increase and decrease the amount of heating by said heater based upon said set point temperature and said ambient temperature.

8. A heated laser assembly for heating a laser to maintain a set point temperature, said heated laser assembly comprising:
   a transistor external to said laser;
   a thermal transfer member in thermal contact with said laser and said transistor, wherein said transistor heats said thermal transfer member to maintain said set point temperature for said laser when ambient temperature is below said set point temperature; and
   a temperature sensor in thermal contact with said thermal transfer member for sensing the temperature of said thermal transfer member wherein said temperature sensor is mounted directly on a printed circuit board of a fiber optic transmitter.

9. The heated laser assembly of claim 8 wherein said transistor is off when said ambient temperature is above said set point temperature.

10. The heated laser assembly of claim 8 further comprising a thermally conductive material between said temperature sensor and said thermal transfer member.

11. The heated laser assembly of claim 8 wherein said laser and said transistor are mounted to a circuit board of said laser and said laser circuit board is vertically mounted to said fiber optic transmitter circuit board to economize space on said fiber optic transmitter circuit board.

12. The heated laser assembly of claim 8 wherein said thermal transfer member is positioned in between said laser and said transistor.

13. The heated laser assembly of claim 8 further comprising a controller for determining when to increase and decrease the amount of heating by said transistor based upon said set point temperature and said ambient temperature.

* * * * *